(12) United States Patent
Wessel et al.

(10) Patent No.: US 6,774,719 B1
(45) Date of Patent: Aug. 10, 2004

(54) POWER AMPLIFIER CONFIGURATION

(75) Inventors: David Neal Wessel, Woodlawn (CA);
John Ilowski, Nepean (CA); Morris Repeta, Ottawa (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 10/661,603

(22) Filed: Sep. 15, 2003

Related U.S. Application Data

(63) Continuation of application No. 10/179,636, filed on Jun. 25, 2002, now Pat. No. 6,646,501.

(51) Int. Cl.[7] .......................... H03G 3/20; H03F 3/04; H03F 3/38
(52) U.S. Cl. ......................... 330/136; 330/302; 330/10
(58) Field of Search ................... 330/136, 302, 330/10

(56) References Cited

U.S. PATENT DOCUMENTS 4,685,041 A * 8/1987 Bowman et al. ............... 363/40
5,373,434 A * 12/1994 Malik .......................... 363/21.1
5,675,288 A   10/1997 Peyrotte et al. .............. 330/149
6,043,707 A    3/2000 Budnik ........................ 330/10
6,191,653 B1   2/2001 Camp, Jr. et al. ............ 330/129
6,366,177 B1   4/2002 McCune et al. ............. 332/103
6,380,802 B1 *  4/2002 Pehike et al. ................. 330/10

FOREIGN PATENT DOCUMENTS

| EP | 0431201      | 6/1990  | ............. H04B/1/04 |
| JP | 357010536 A * | 1/1982 | ............. H04B/1/26 |
| WO | 0124356      | 9/2000  | ............. H03C/5/00 |

* cited by examiner

Primary Examiner—Patricia Nguyen

(57) ABSTRACT

A variable capacitance and control system used in a compensative manner to improve efficiency in power amplifier arrangements arranged to receive a power input which is voltage-modulated responsive to at least one control signal representative of the data signal. Also included are methods and software for controlling said power amplifier arrangements including the variable capacitance and control system. The data input to the power amplifier is pre-distorted and the resulting power amplification is substantially linear. The arrangement may be used in wireless base station transmitters, for example. Improved data transmission services are also provided which make use of such power amplifiers.

37 Claims, 9 Drawing Sheets

POWER AMPLIFIER CONFIGURATION

RELATED APPLICATION

The application is a continuation in part of U.S. patent application Ser. No. 10/179,636 filed Jun. 25, 2002 now U.S. Pat. No. 6,646,508.

FIELD OF THE INVENTION

The present invention relates to a method and apparatus for power amplification and a system incorporating the same. The invention is particularly, but not exclusively, intended for use in a wireless communications base station.

BACKGROUND TO THE INVENTION

Known wireless communications systems require provision of a high power signal for transmission in order to ensure reception over a suitably wide area. This is achieved by amplifying the data signal to be transmitted, typically at a wireless base station itself, and feeding the resulting amplified signal to the antenna array for wireless transmission. The high amplification levels required for such applications can lead to non-linear distortion of the data signal, which is undesirable. It is therefore highly desirable to use high-performance, linear power amplifier architectures in such applications.

A problem with known linear Power Amplifier (PA) technology is that a static back-off, proportional to the signal statistics (Complementary Cumulative Distribution Function (CCDF)), is required to obtain linearity in the system. This back-off decreases the maximum obtainable efficiency of the system and drives mechanical, thermal, and overhead powering costs for wireless transmit architectures. Known techniques yield PA efficiencies in the order of 10–12% for high power designs for signals with high peak-to-mean ratios such as Code Division Multiple Access (CDMA) and Wideband CDMA (W-CDMA). It is therefore desirable to improve the efficiency of power amplifiers so as to reduce operating costs.

Known solutions include Envelope Elimination and Recovery (EER) but such solutions have limited performance due to cross modulation induced by varying the DC voltage applied to the device output. EER cannot be easily incorporated in a wideband architecture since the cross modulation ultimately limits the system linearity and hence limits the ability to meet current standards requirements. Significant memory components are added to the signal envelope at wide bandwidths thus creating an inherently non-linear system.

Power amplifiers today account for a high proportion of wireless Basestation Transmitter System (BTS) costs. In addition, infrastructure support for the power amplifiers (in terms of mechanical, cooling, and DC powering), combined with the basic power amplifiers costs, total a majority of BTS costs. It is therefore desirable to identify means whereby to reduce installation and/or operating costs of such systems.

SUMMARY OF THE INVENTION

According to one broad aspect, the invention provides a power amplifier arrangement comprising: a power amplifier for receiving an input signal and amplifying said input signal to form an output signal, the power amplifier having an output capacitance which varies; a power supply for supplying a power supply voltage to the power amplifier which is modulated proportionally with respect to changes in the input signal; a variable capacitor having a variable capacitance which in combination with the output capacitance results in an adjusted output capacitance, wherein the variable capacitor is controlled so that the adjusted output capacitance is substantially constant.

Some embodiments further comprise a signal processing unit for receiving said input signal and for providing a first control signal to the power supply, said signal processing unit forming said first control signal responsive to said input signal; wherein the power supply modulates the power supply voltage in response to the first control signal so as to vary said power supply voltage proportionally with respect to changes in the input signal.

In some embodiments, a signal processing unit is adapted to generate a second control signal to the variable capacitor which controls the variable capacitance of the variable capacitor for the purpose of maintaining the adjusted output capacitance to be substantially constant.

In some embodiments, an input signal to the power amplifier is time delayed to allow the power supply voltage to be modulated in time with amplification of the input signal by the power amplifier; and the second control signal is time delayed, synchronous with the input signal to the power amplifier, to allow the substantially constant adjusted output capacitance to be provided even while the output capacitance of the power amplifier is changing due to a change in operating power supplied to the power amplifier caused by modulation of the power amplifier power supply by the input signal.

In some embodiments, the variable capacitor is located at an output stage of the power amplifier.

In some embodiments, an impedance matching network is connected at the output of the power amplifier to provide impedance matching to an output impedance of the power amplifier.

In some embodiments, the adjusted output capacitance is a function of the output capacitance, as well as a function of a capacitance of the variable capacitor, such that the adjusted output capacitance=f(output capacitance, capacitance of the variable capacitor), and wherein the capacitance of the variable capacitor is controlled such that the adjusted output capacitance is substantially constant.

Some embodiments further comprise a predistortion module for providing a predistorted version of the input signal to the power amplifier, said predistortion module receiving from the signal processing unit predistortion coefficients for distorting said input signal, said predistortion coefficients being formed by said signal processing unit responsive to said input signal.

In some embodiments, the signal processing unit receives a feedback signal from at least one of the power amplifier and the power supply and wherein said first control signal formed by the signal processing unit is formed using at least one of the input signal, a power supply feedback signal and a power amplifier feedback signal.

In some embodiments, the variable capacitor is a high power, high Q-factor device.

In some embodiments, the variable capacitor is a voltage controlled device.

In some embodiments, the voltage controlled device is a micro-electromechanical system (MEMS) device.

In some embodiments, the variable capacitor is a current controlled device.

In some embodiments, the current controlled device is a micro-electromechanical system (MEMS) device.

Some embodiments further comprise a digital-to-analog converter, a low pass filter and an operational amplifier, wherein the signal processing unit is adapted to generate the second control signal based on a lookup table means and supply the second control signal to the variable capacitor, via serial succession of the digital-to-analog converter, the low pass filter and the operational amplifier placed between the signal processing unit and the variable capacitor, which controls the variable capacitance of the variable capacitor so that the adjusted output capacitance is substantially constant.

In some embodiments the variable capacitor is a microelectromechanical system (MEMS) device comprised of a flexible top plate, a fixed bottom plate, and at least one support post to support the flexible top plate.

According to another broad aspect, the invention provides a method of operating a power amplifier arrangement, comprising the steps of: providing an input signal to a power amplifier, the power amplifier amplifying the input signal to form an output signal, the power amplifier having an output capacitance which varies; providing a power supply voltage to the amplifier to enable the power amplifier to amplify the input signal; modulating the power supply voltage to the power amplifier in response to a first control signal received by the power supply from a signal processing unit, said signal processing unit forming said first control signal responsive to the input signal, wherein the power supply modulates the power supply voltage so as to vary said power supply voltage proportionally with respect to changes in the input signal; providing a second control signal from the signal processing unit to a variable capacitor having a variable capacitance which in combination with the output capacitance results in an adjusted output capacitance, said signal processing unit adapted to generate the second control signal which controls the variable capacitance of the variable capacitor so that the adjusted output capacitance is substantially constant; and time delaying inputting of the input signal to the power amplifier in order to allow the power supply voltage to be modulated in time with amplification of the input signal by the power amplifier.

In some embodiments, the method further comprises the step of time delaying inputting the second control signal, synchronous with the input signal to the power amplifier, to the variable capacitor so that the variable capacitance of the variable capacitor is controlled for the purpose of maintaining the adjusted output capacitance to be substantially constant.

In some embodiments, the method further comprises the step of predistorting the input signal so as to provide the power amplifier with a predistorted version of the input signal for amplification.

In some embodiments, the input signal is predistorted by a predistortion module which receives predistortion coefficients generated by the signal processing unit, said predistortion coefficients being generated by the signal processing unit responsive to the input signal.

In some embodiments, the method further comprises providing to the signal processing unit a feedback signal from at least one of the power amplifier and the power supply and wherein the first control signal is formed by the signal processing unit utilizing at least one of the input signal, a power supply feedback signal and a power amplifier feedback signal.

In some embodiments, the variable capacitor is a voltage controlled device.

In some embodiments, the variable capacitor is a current controlled device.

In some embodiments, the variable capacitor is a microelectromechanical system (MEMS) device.

According to another broad aspect, the invention provides a wireless communications base station transmitter including a power amplifier arrangement.

According to another broad aspect, the invention provides a communications network including a power amplifier arrangement.

According to another broad aspect, the invention provides a method of amplifying an input signal using a power amplifier having a power supply input, the method comprising the steps of: receiving the input signal; amplifying the input signal using the power amplifier to provide an output signal, the power amplifier having an output capacitance which varies; modulating the power supply input to the power amplifier in accordance with a first control signal responsive to said input signal, wherein the method includes the step of time delaying inputting of the input signal to the power amplifier to allow the power supply input to be modulated in time with amplification of the input signal by the power amplifier; and providing a second control signal to a variable capacitor having a variable capacitance which in combination with the output capacitance results in an adjusted output capacitance, wherein the second control signal controls the variable capacitance of the variable capacitor so that the adjusted output capacitance is substantially constant.

In some embodiments, the method further comprises the step of time delaying inputting the second control signal, synchronous with the input signal to the power amplifier, to the variable capacitor so that the variable capacitance of the variable capacitor is controlled for the purpose of maintaining the adjusted output capacitance to be substantially constant.

In some embodiments, the variable capacitor is a voltage controlled device.

In some embodiments, the variable capacitor is a current controlled device.

In some embodiments, the variable capacitor is a microelectromechanical system (MEMS) device.

According to another broad aspect, the invention provides a program for a computer for controlling a power amplifier arrangement comprising a power amplifier, a power supply, and a signal processing unit, the program comprising code to carry out the steps of: providing an input signal to the power amplifier, the power amplifier amplifying the input signal to form an output signal, the power amplifier having an output capacitance which varies; providing a power supply voltage to the power amplifier to enable the power amplifier to amplify the input signal; modulating the power supply voltage to the power amplifier in response to a first control signal received by the power supply from a signal processing unit, said signal processing unit forming said control signal responsive to the input signal, wherein the power supply modulates the power supply voltage so as to vary said power supply voltage proportionally with respect to changes in the input signal; providing a second control signal from the signal processing unit to a variable capacitor having a variable capacitance which in combination with the output capacitance results in an adjusted output capacitance, said signal processing unit adapted to generate the second control signal which controls the variable capacitance of the variable capacitor so that the adjusted output capacitance is substantially constant; and time delaying inputting of the input signal to the power amplifier in order to allow the power supply voltage to be modulated in time with amplification of the input signal by the power amplifier.

In some embodiments, the program further comprises code to carry out the step of time delaying inputting the second control signal, synchronous with the input signal to the power amplifier, to the variable capacitor so that the variable capacitance of the variable capacitor is controlled for the purpose of maintaining the adjusted output capacitance to be substantially constant.

According to another broad aspect, the invention provides a method of providing a signal transmission service over a communications network including a power amplifier arrangement.

BRIEF DESCRIPTION OF THE DRAWINGS

Preferred embodiments of the invention will now be described with reference to the attached drawings in which.

DETAILED DESCRIPTION OF INVENTION

Figure 1:
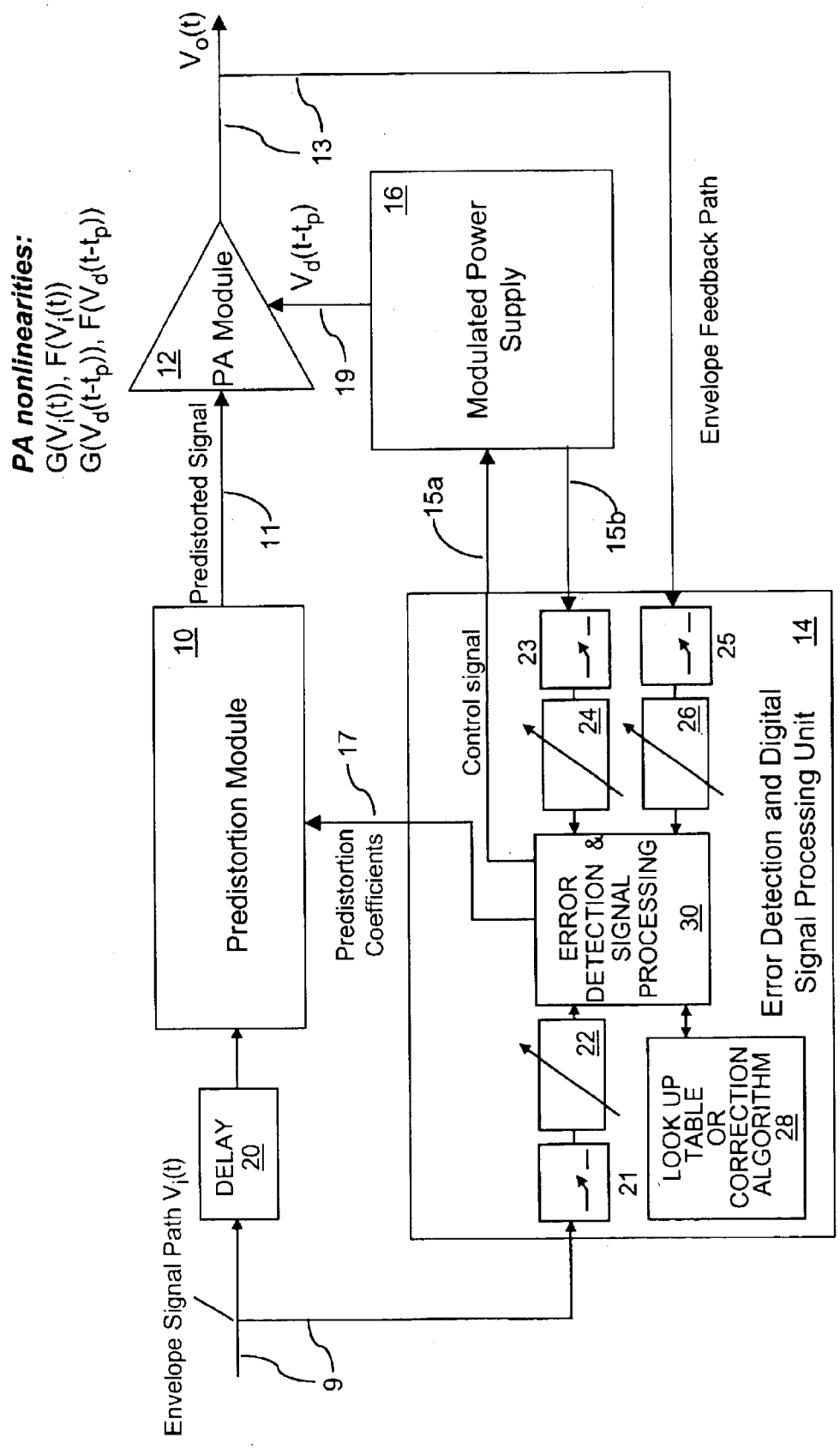
FIG. 1 is a schematic of a power amplifier arrangement provided by an embodiment of the present invention.

Referring to FIG. 1, there is shown a power amplifier arrangement having a predistortion module 10, a power amplifier module 12, an error detection and digital signal processing unit 14, and a modulated power supply 16. In this arrangement an envelope signal path 9 is arranged to provide the envelope signal both to the predistortion module 10 and the error detection and digital signal processing unit 14, the error detection and digital signal processing unit being arranged to provide 17 the predistortion coefficients to the predistortion module. The predistortion module provides 11 a predistorted version of the envelope signal to the power amplifier module 12, which in turn provides 13 an amplified version of the predistorted signal. The modulated power supply 16 provides 19 a power input to the power amplifier module 12, responsive to inputs 15a received from the error detection and digital signal processing unit 14. The error detection and digital signal processing unit 14 receives feedback both from 15b the modulated power supply and from 13 the output from the power amplifier module.

The arrangement provides active DC power supply modulation in power amplifier arrangement whereby to improve and optimise the power amplifier efficiency in high dynamic range signals including, but not limited to, CDMA and W-CDMA. The error detection and digital signal processing unit 14 detects the input waveform 9 which may then be used 15a to control the modulated power supply 16 in such a way as to allow the power amplifier module 12 to operate very close to its compression point at all times during the envelope: that is, to operate the device effectively at the maximum available power for a given supply voltage. When operating within the linear region of the amplifier, gain is substantially uniform. As the input signal is increased in power, a point is reached where the input signal is not amplified by the same amount as lower power input signals. This point is known as the compression point. Operation very close to the compression point facilitates operation of the power amplifier module at its highest efficiency point.

The power supply output voltage is modulated in such a manner as to reduce the output voltage proportional to the reduction in the envelope voltage in order to operate the RF power devices at a point very near maximum compressed power over the entire envelope range.

The predistortion module 10 is arranged to compensate for Amplitude Modulation/Amplitude Modulation (AM/AM) and Amplitude Modulation/Phase Modulation (AM/PM) conversion distortion, created as a result of application of the DC bias modulation to the power amplifier module as well as inherent device nonlinearities, so as to provide a substantially linear amplification characteristic over the operating range of the arrangement. The scheme differs from the classic envelope illumination and recovery (EER) techniques at least in that it allows the composite waveform to propagate through the entire system, thus allowing effective predistortion of the envelope signal and yielding a linear composite output from the power amplifier. Additionally it compensates for memory produced in the system as a result of imperfections in the tracking of the power supply to the signal envelope.

The signal input waveform is sampled by sample block 21. The sample is then processed to determine the exact value of DC voltage to apply to the output devices in the modulated power supply 16 for the required waveform power level. Simultaneous to this process, the waveform sample is used to determine the optimum pre-distortion coefficients 17 to apply to the waveform to ensure the system linearity.

The input wave is time delayed to allow for proper processing and envelope alignment of the pre-distortion coefficients and proper timing of the DC power supply modulation on the waveform.

Separately, in an offline process, the output waveform is sampled and compared to the clean input waveform to actively adapt both the pre-distortion and DC modulation coefficients to optimise the system efficiency and linearity.

Referring to FIG. 1 of the drawings, a primary and secondary path will be discussed. The primary path is the path taken by an input signal which is received at the main input, passes through the predistortion module 10 and is applied to the power amplifier 12. The secondary path is the signal processing path following a route in the lower part of FIG. 1.

In the primary path an input signal to the system is delayed, by delay unit 20, before it reaches the predistortion module 10. The delay can be achieved in various ways. To avoid signal processing, the signal can be passed through a large coil of coaxial cable of an appropriate length. Alternatively, standard signal processing techniques can be used to sample and delay the signal by holding and shifting the sampled signal through a memory device. The delay unit 20 provides a delay, which is at least as long as that which will be incurred by signal processing in the secondary path.

In the secondary path an input signal is sampled 21 to derive the magnitude of the signal envelope and delayed 22 (if necessary) before being processed 30 to derive suitable predistortion coefficients 17 for applying to the predistortion module 10. One manner in which the coefficients are selected is by referring to a look up table 28 stored within error detection and signal processing unit 14. In another embodiment the coefficients are generated with the use of an algorithm 28 that calculates the predistortion coefficients. It is these steps of sampling and processing the signal, as well as analogue circuit constraints, which incur a delay in the secondary path.

The delay 22 is a variable delay which can be implemented by standard digital memory techniques. The value of delay 22 is chosen so that the input signal travelling along the primary path arrives at the predistortion module 10 at exactly the same time as the appropriate predistortion coefficients 17 are applied to the module 10. In other words, predistortion coefficients 17, which have been based on a particular part of the sampled input signal, are applied at the same time as that part of the input signal (on which the coefficients are based) arrives at the predistortion module 10. In this way, the predistortion module 10 applies the correct amount of distortion to the correct part of the input signal and the resulting output of the power amplifier is made as linear as possible. The predistortion module 10 can correct amplitude (gain) and phase of the input signal.

Similarly, time delaying the input signal on the primary path results in the power supply voltage being modulated in time with the input signal, passing along the primary path, arriving at the power amplifier 12. This can be explained in another way. Processing unit 30 determines an appropriate value for the power supply modulation control signal 15a based on sampled values of part of an input signal 9. Delaying the input signal ensures that the control signal 15a modulates the power supply 16 at the same time as that part of the input signal (on which the control signal 15a is based) arrives at the power amplifier 12. Thus, at any point in time, the voltage applied by power supply 16 is matched to the input signal passing through the amplifier.

As shown in FIG. 1, the feedback signal 15b from the power supply 16 and the feedback signal from the output are also sampled and time delayed at inputs to the error detection and digital signal processing unit 14, blocks 23, 24 and 25, 26 to ensure that the feedback signals can be properly compared to the input signal.

Preferably the power amplifier transfer characteristic is dependent on power supply unit (PSU) supply voltage, which is being modulated, and the input envelope modulation. A preferred power amplifier transfer characteristic is:

Gain=f(envelope voltage, PSU voltage) Phase=f (envelope voltage, PSU voltage) Efficiency=f($P_{sat}$, $P_{out}$) ; $P_{sat}$=f(envelope voltage)

where $P_{sat}$ is defined as the saturation power of a transistor used in the power amplifier.

Figure 2:
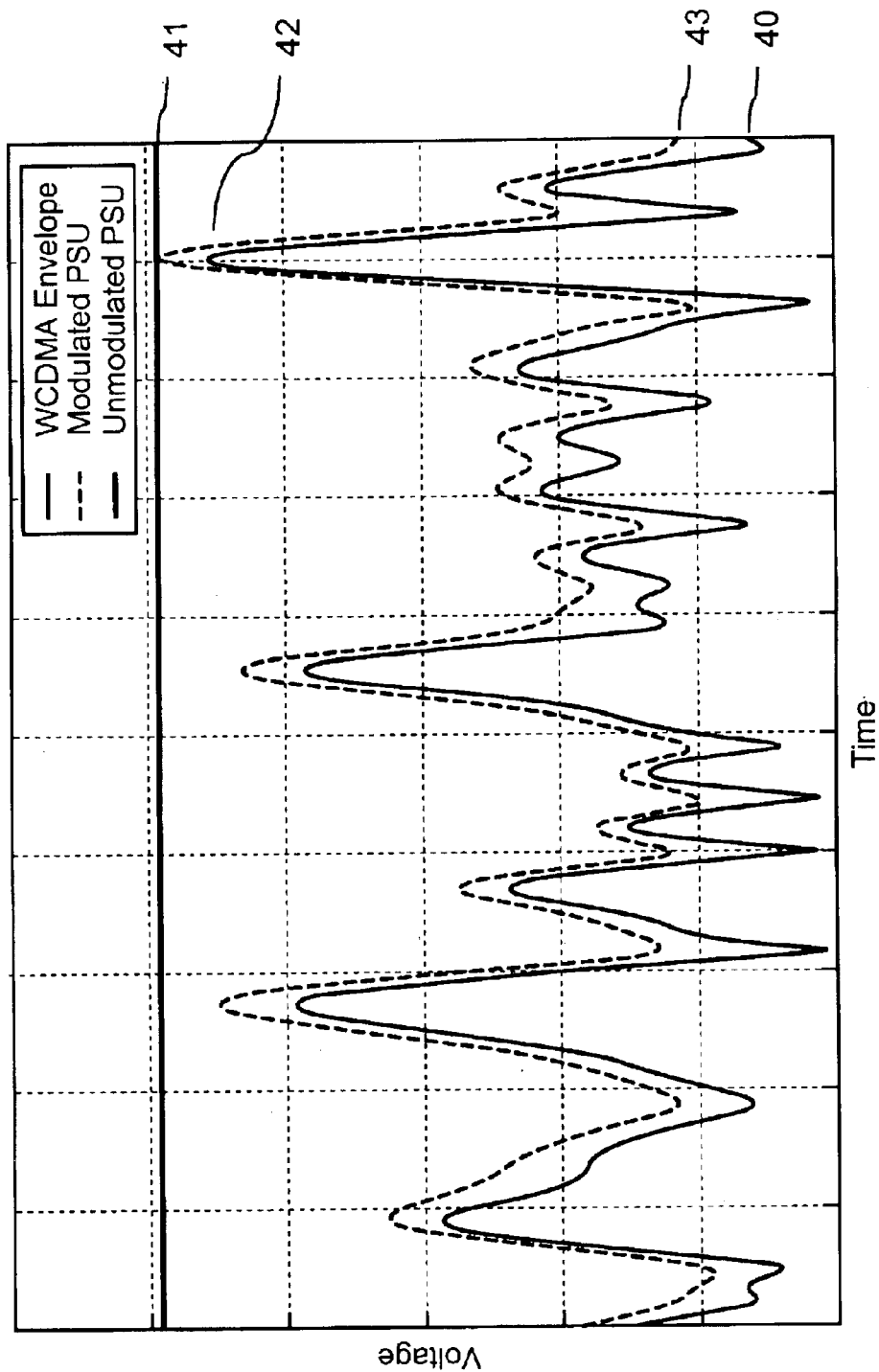
FIG. 2 is a graph of an example of modulation of a power supply in accordance with an embodiment of the present invention.

Referring now to FIG. 2, there is shown a graphical representation of the respective voltages over time of:

an output signal envelope 40;

a conventional amplifier which holds power supply voltage ($V_{dd}$) constant 41 at a level sufficient to amplify the peaks 42 in the data signal envelope; and the dynamically modulated power supply voltage ($V_{dd}$) envelope 43 arranged to follow the data signal envelope 40.

As the graph shows, modulation of the power supply voltage to track the signal envelope significantly reduces amplifier power wastage, as represented by the difference in power between the dynamically modulated power supply voltage 43 and the conventional constant voltage 41. For example, studies have shown that for an unmodulated power supply having an average efficiency of approximately 13%, a corresponding efficiency of 27.5% can be achieved using supply voltage modulation of the power supply unit according to the present technique.

Figure 3:
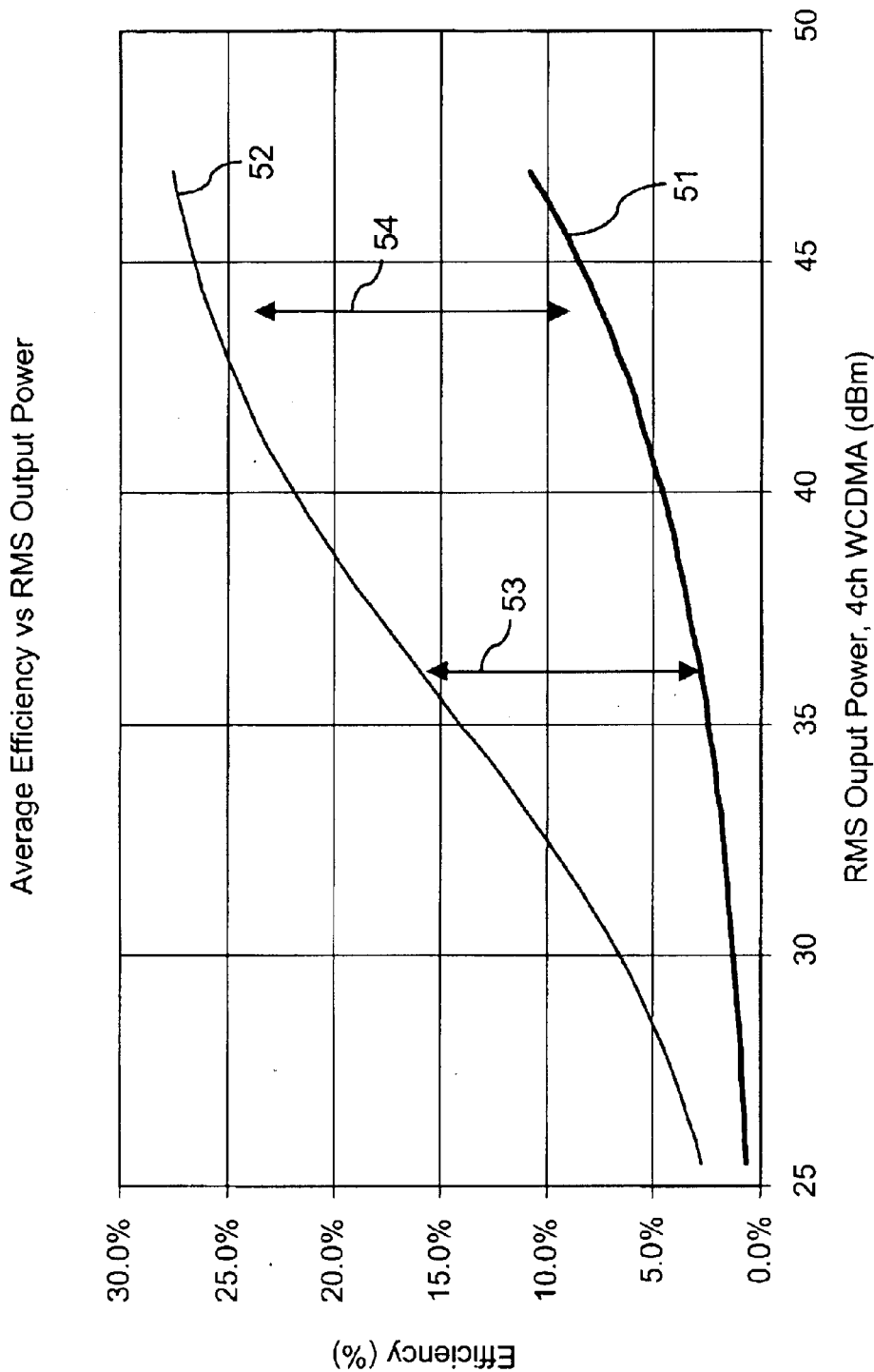
FIG. 3 is an example graph illustrating improved amplifier efficiency in accordance with an embodiment of the present inventions.

Referring now to FIG. 3, there is shown a graphical representation of the relationship between average power efficiency and RMS output power of a PA arrangement for a four channel W-CDMA system. The graph shows a first plot 51 of efficiency for a conventional amplifier arrangement having a static power supply voltage, $V_{dd}$, and a second plot 52 showing a corresponding efficiency for a similar arrangement but in which the power supply voltage is dynamically modulated to follow the signal envelope. As the graph,shows, efficiency degrades gracefully over the power control range as the linearizer overhead starts 54 to dominate, but significant benefit 53 can still be obtained even at reduced powers.

Figure 4:
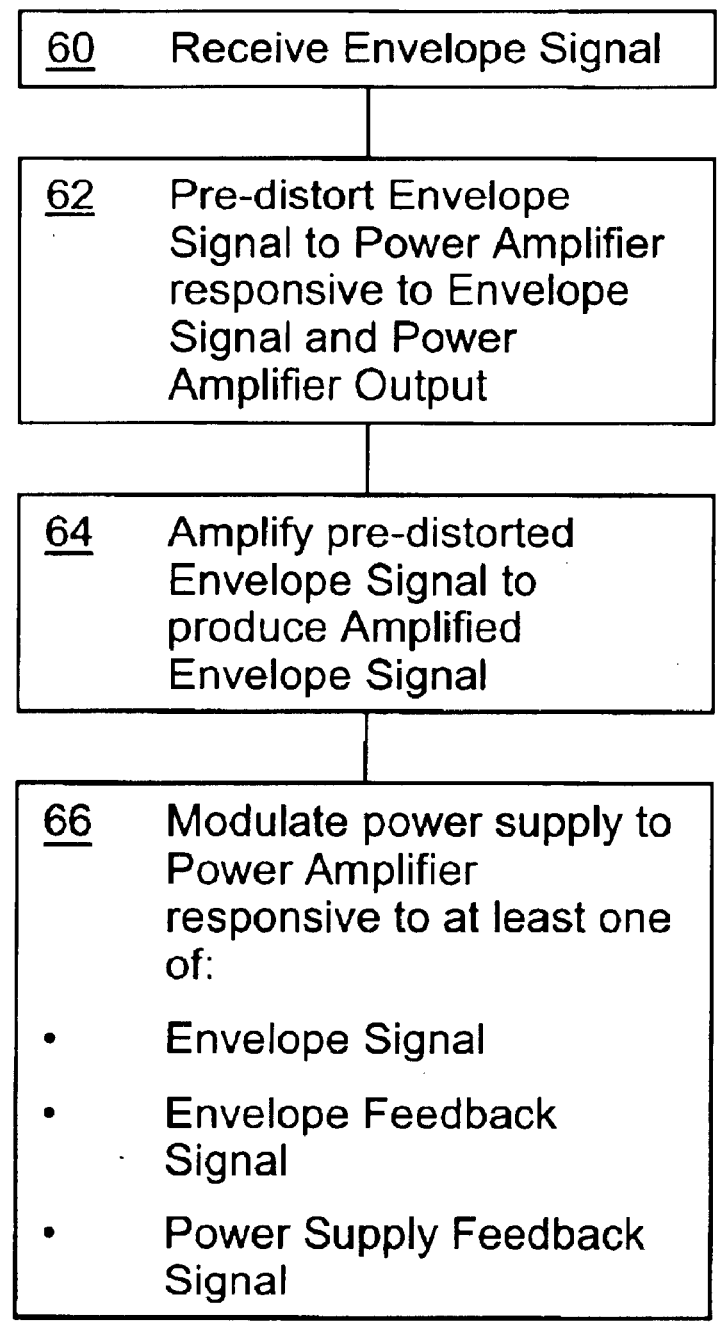
FIG. 4 is a flowchart of a power amplification method provided by an embodiment of the present invention.

Referring now to FIG. 4, the method comprises the steps of: receiving 60 an envelope signal; predistorting 62 the envelope signal to provide a predistorted input to the power amplifier compensating for non-linearities introduced elsewhere in the arrangement; amplifying 64 the predistorted envelope signal to produce an amplified envelope signal; and modulating 66 the power supply to the power amplifier. The modulation is performed responsive to at least one of the envelope signal 9, the envelope feedback signal 13, and the power supply feedback signal 15b.

Figure 5:
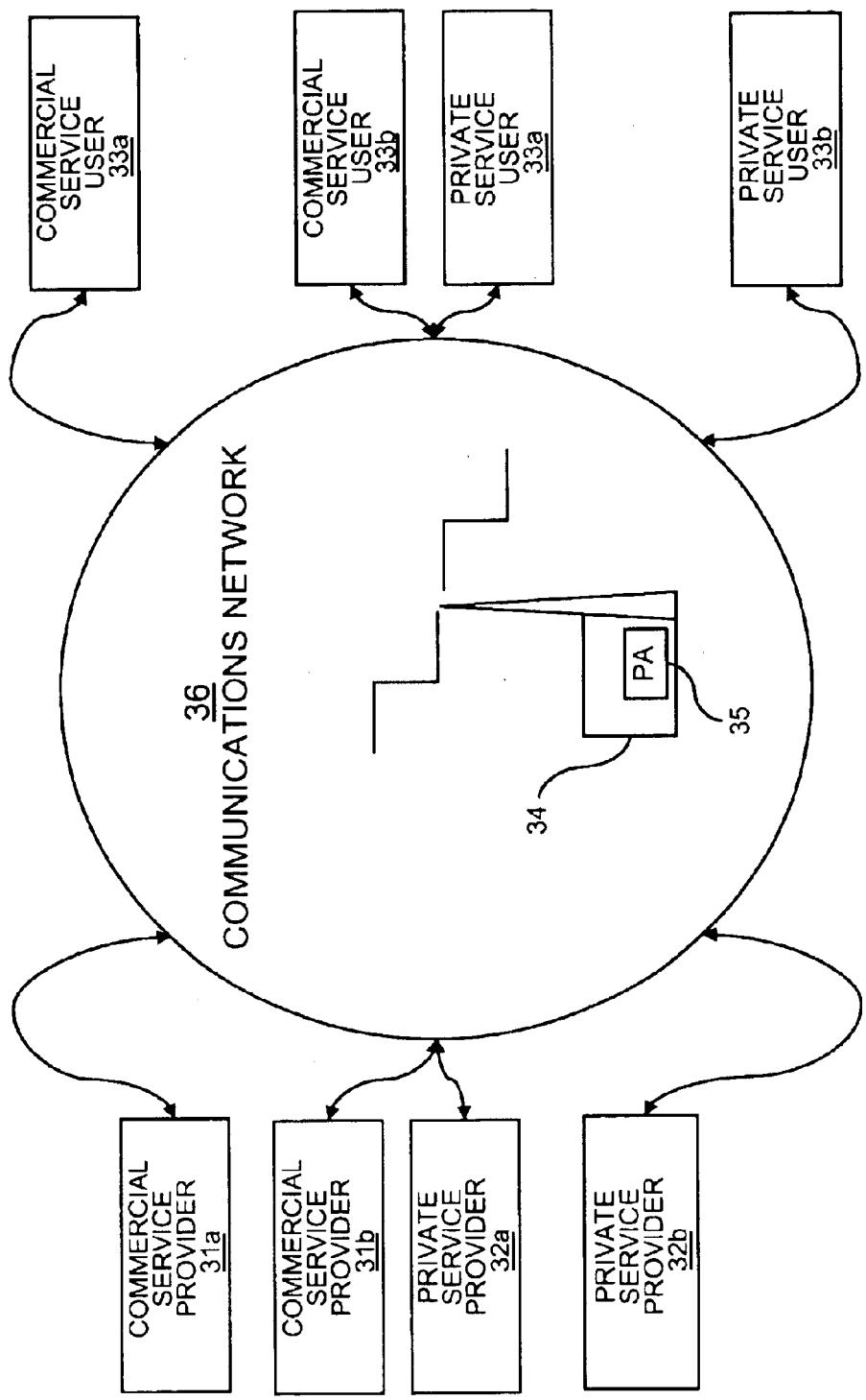
FIG. 5 is a system diagram of an example data transmission service offered over a communications network utilizing a power amplifier arrangement provided by an embodiment of the present invention.

Referring now to FIG. 5, the power amplifier provides an improved quality of service for data transmission services provided over a network 36 utilizing such power amplifier arrangements 35. In the example illustrated the PA arrangement is provided in a wireless base station 34. Such services may be provided between commercial 31a–b or private 32a–b service providers, and commercial 33a–b or private 34a–b subscribers. As is well understood in the art, a single entity may act either as provider or consumer or both in respect of any such service or services.

In another embodiment, in order to further improve the performance of the above described embodiments in the context of a fixed matching network, a variable capacitor is used to stabilize a drain-source capacitance which exists at the output of an amplifier stage. This embodiment will now be described with reference to FIGS. 6 to 9.

Figure 6:
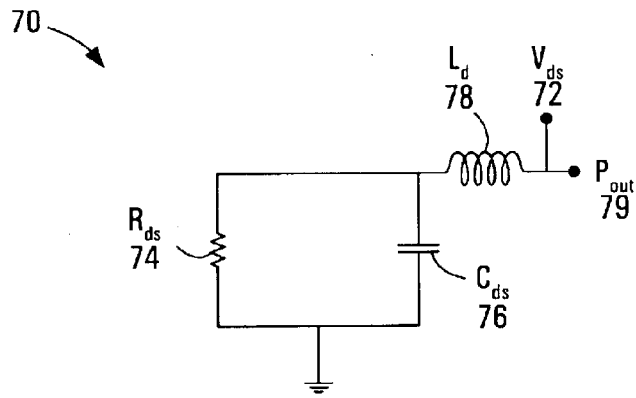
FIG. 6 is a schematic of an equivalent circuit model of a power amplifier used in an embodiment of the power amplifier module of FIG. 1.

FIG. 6 illustrates a model of an output stage of a power amplifier 70 of a type, that might for example, be used in an embodiment of the PA Module 12 shown in FIG. 1. FIG. 6 shows an equivalent electrical circuit model for the embodiment of the output stage of the power amplifier used in the PA module 12. A power supply voltage $V_{ds}$ 72 is a drain to source voltage supplied to the power amplifier, which is supplied by the Modulated Power Supply 16 of FIG. 1. There are three equivalent circuit values to represent the resistance, capacitance and inductance of the circuit. These values are an equivalent resistance $R_{ds}$ 74, an equivalent capacitance $C_{ds}$ 76 and an equivalent inductance $L_d$ 78. Output power generated by the power amplifier is represented by $P_{out}$ 79. $R_{ds}$ 74 and $C_{ds}$ 76 are shown connected in parallel between ground and a node which connects to one side of an element representing $L_d$ 78. The power supply voltage $V_{ds}$ 72 is supplied at a node that connects to the other side of the element representing $L_d$ 78 and the location representing where the power output 79 is determined.

In the model, the equivalent resistance $R_{ds}$ 74 is a function of the power supply voltage $V_{ds}$ 72. This results in the equivalent resistance $R_{ds}$ 74 also being a function of the input signal envelope due to the manner in which the power supply voltage $V_{ds}$ 72 is modulated as a function of the input signal envelope. Equation 1 shows a relationship between the output power $P_{out}$, the power supply voltage $V_{ds}$ 72 and the equivalent resistance $R_{ds}$ 74.

$$P_{out} \approx \frac{V_{ds}^2}{2R_{ds}} \qquad \text{Eq. 1}$$

If the equivalent resistance $R_{ds}$ 74 can be kept constant, in the absence of $C_{ds}$ 76, it becomes simple to provide proper impedance matching between an output of the power amplifier and a system connected to the power amplifier. By varying the power supply voltage $V_{ds}$ 72 as a function of both output power $P_{out}$ and input signal envelope, the equivalent resistance $R_{ds}$ 74 is maintained as a constant. A fixed matching network is then used at the output of the power amplifier, which results in a higher efficiency for a system containing the power amplifier.

The equivalent capacitance $C_{ds}$ 76 shown in FIG. 6 is a function of the power supply voltage $v_{ds}$ 72. Unfortunately the equivalent capacitance $C_{ds}$ 76 is not a function of the output power $P_{out}$, as is the case with the equivalent resistance $R_{ds}$. This creates a mismatch between the output of the power amplifier and the fixed matching network when $V_{ds}$ 72 is modulated as a function of the input signal envelope and the output power $P_{out}$. The mismatch causes a loss in power and therefore lowers efficiency in the system containing the power amplifier. Due to the functional relationships between the input envelope signal, the power supply voltage $V_{ds}$ 72, the equivalent resistance $R_{ds}$ 74 and the equivalent capacitance $C_{ds}$ 76 as described above there is only a small range of values of the input envelope signal where the system efficiency attains a maximum value. Elsewhere around this small optimal range the efficiency of the system decreases.

Figure 7A:
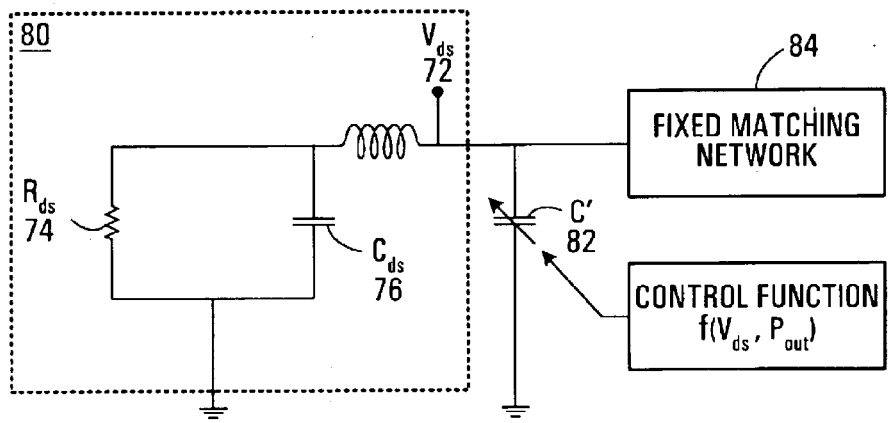
FIG. 7A is a schematic of an equivalent circuit model of the power amplifier shown in FIG. 6 equipped with a fixed matching network and a variable capacitor provided by an embodiment of the invention.
Figure 7B:
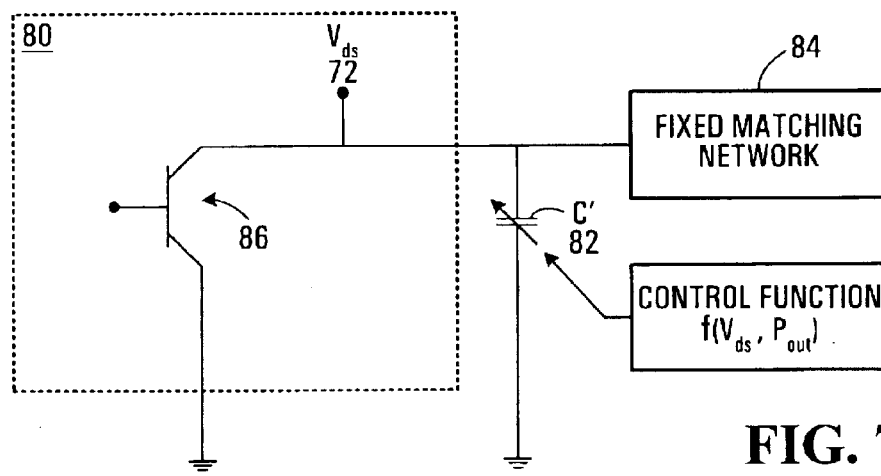
FIG. 7B is a schematic of a transistor implementation of the power amplifier shown in FIG. 6 equipped with a fixed matching network and a variable capacitor provided by an embodiment of the invention.

FIG. 7A and FIG. 7B illustrate an embodiment of a solution to the situation of an impedance mismatch between an output stage of a power amplifier and a fixed matching network. FIG. 7A uses the equivalent electrical circuit model of the power amplifier 80 as described and shown in FIG. 6. In addition to the equivalent electrical circuit model of the power amplifier 80 the figure includes a variable capacitor C' 82 and associated controlling mechanism that controls the variable capacitor C' 82 as a function of the input signal envelope. Also shown is a fixed matched network 84 connected at the output of the amplifier. FIG. 7B shows a transistor implementation of the power amplifier 80 as well as includes the variable capacitor C' 82 and associated controlling mechanism that controls the variable capacitor C' 82 as a function of the input signal envelope. The fixed matching network 84 is shown attached at the output of the amplifier in the same manner as FIG. 7A. The transistor implementation of the power amplifier 80 shows the power supply voltage $V_{ds}$ 72 and a representative transistor 86.

Inserting the tuneable capacitor C' 82 at the output stage of the power amplifier 80 used in conjunction with the fixed matching network 84, allows a higher efficiency to be maintained for the system containing the power amplifier. The fixed matching network 84 matches the equivalent resistance of the power amplifier $R_{ds}$ 74 while the variable capacitor C' 82 is used to counteract the variation in the equivalent capacitance of the power amplifier $C_{ds}$ 76 as the power supply voltage $V_{ds}$ 72 is modulated. The combination of the variable capacitor C' 82 and the equivalent capacitance $C_{ds}$ 76 provide a substantially constant capacitance that is observed at the output of the arrangement, thereby allowing a fixed matching network to be effective.

Figure 8:
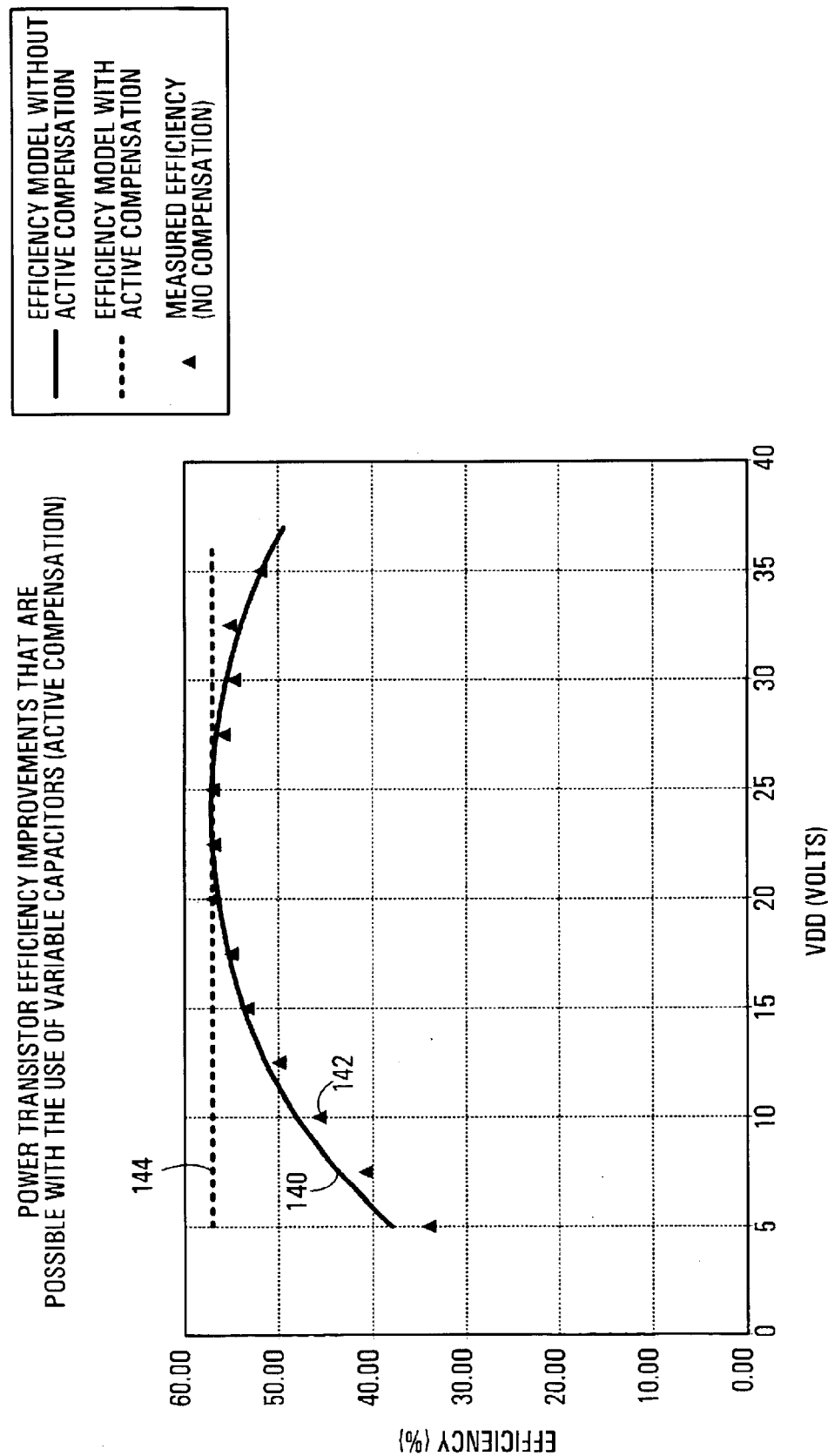
FIG. 8 is a graph illustrating power transistor efficiency as a function of power supply voltage achievable with an example implementation of an embodiment of the present invention.

FIG. 8 shows a plot of power transistor efficiency versus an applied power supply voltage $V_{dd}$, with and without active compensation. Information from three different cases is detailed in the graph, an efficiency model without active compensation 140, a measured efficiency without active compensation 142, and an efficiency model with active compensation 144. The efficiency model without active compensation 140 and the measured efficiency without active compensation 142 both show that efficiency varies between approximately 38% and 57% with the applied power supply voltage range shown in the figure. In these two cases the maximum efficiency of approximately 57% only exists for a narrow range of the applied power supply voltage. The efficiency model with active compensation 144 however, is constant at approximately 57% for all values of the applied power supply voltage shown in the figure.

In some embodiments as described above, the equivalent capacitance $C_{ds}$ is a function of the power supply voltage $V_{ds}$ so that f1=$C_{ds}(V_{ds})$. The variable capacitance C' is related to the modulated power supply voltage $V_{ds}$ through a second function, such that f2=C' ($V_{ds}$). In some embodiments, such as the illustrated embodiment of FIG. 7A where the variable capacitor is connected at the output of the power amplifier, the variable capacitor C' is located in the network so that the overall capacitance is the product of functions f1 and f2, resulting in an overall capacitance, $C(C_{ds},C')$=f1*f2, where f1=$C_{ds}(V_{ds})$ and f2=C'($V_{ds}$). Therefore, the function required to control C', such that the overall capacitance is substantially constant is the inverse of the function that determines $C_{ds}$, which is f2=f1-1. Different functional relationships may exist for other configurations.

Preferably, a high power, high Q factor device is employed for implementing a variable capacitance for use in this application. This is because:

1) When using very high voltage and high power systems any circuit losses bring down the efficiency of the system.

2) In terms of speed or slew rate the variable capacitance is preferably capable of being modulated at 10–20 MHz for a 10–20 MHz bandwidth system and appropriately scaled for other system bandwidths.

In some embodiments the variable capacitor is a voltage controlled device and in other embodiments the variable capacitor is a current controlled device.

Figure 9:
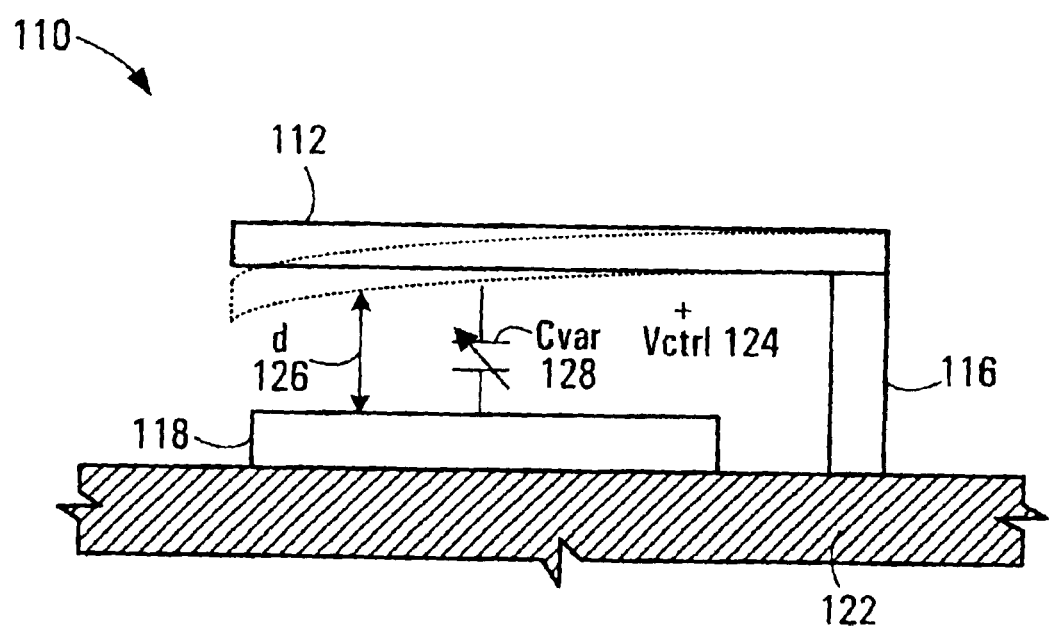
FIG. 9 is a side view of a MEMS device for use as a variable capacitor in the embodiment of the matching networks shown in FIGS. 7A and 7B.

In a preferred embodiment a micro-mechanical system (MEMS) device is proposed for use as the variable capacitor. MEMS devices have been developed over the last several years that are capable of being manufactured with a high Q factor. FIG. 9 shows an embodiment of a representative MEMS device that consists of a parallel-plate capacitor 110. The parallel-plate capacitor consists of a top plate 112, a single support post 116, and a fixed bottom plate 118. The top plate 112 is supported by the single support post 116 creating a cantilever structure. The top plate 112 is positioned over the fixed bottom plate 118, which is located on a substrate 122. The distance between the top plate 112 and the fixed bottom plate 118 is initially determined by the height of the support post 116.

The top plate 112 acts as a first electrode of the parallel-plate capacitor whereas the bottom plate 118 acts as a second electrode. Assuming that the fixed bottom plate 118 is electrically grounded, upon application of a positive voltage $V_{ctrl}$ 124 supplied via the top plate 112, an attractive electrostatic force is generated between the top plate 112 and the fixed bottom plate 118. The attractive electrostatic force overcomes the stiffness of the top plate 112, causing it to bend toward the fixed bottom plate. The distance d 126 between the top plate 112 and the fixed bottom plate 118 is determined when the electrostatic force and spring force are at equilibrium. This is depicted as the broken line version of the top plate 112 in FIG. 9. The change in distance between the top plate 112 and the fixed bottom plate 118 results in a change in a capacitance $C_{var}$ 128 that exists between the top plate 112 and the fixed bottom plate 118. The resulting distance 126 between the top plate 112 and the fixed bottom plate 118 is inversely proportional to $V_{ctrl}$ 124 and since the capacitance $C_{var}$ 128 is inversely proportional to the distance d 126, the capacitance $C_{var}$ 128 will be directly proportional to $V_{ctrl}$ 124. The same principle applies to changing the capacitance 128 by using a negative voltage $V_{ctrl}$ 124, supplied via the top plate 112 acting as the first electrode to created a repellent electrostatic force between the top plate 112 and the fixed bottom plate 118 acting as the second electrode. I this case the distance between the top plate 112 and the fixed bottom plate 118 increases the distance d 126.

In some embodiments of the variable capacitor MEMS device the top plate is only supported by one support post as a cantilever structure and in other embodiments there are multiple support posts supporting the top plate in multiple locations.

In some embodiments the variable capacitor MEMS device is a voltage controlled device and in other embodiments the variable capacitor MEMS device is a current controlled device.

In some embodiments the variable capacitor MEMS device can be manufactured by any of the conventional micro-machining MEMS fabrication means available using materials such as silicon, polysilicon, and aluminium.

Persons skilled in the art will appreciate that there are yet more alternative implementations and modifications possible to the above described embodiments of the MEMS variable capacitor, and that the above are only an illustration of the possible embodiments of the invention.

Figure 10:
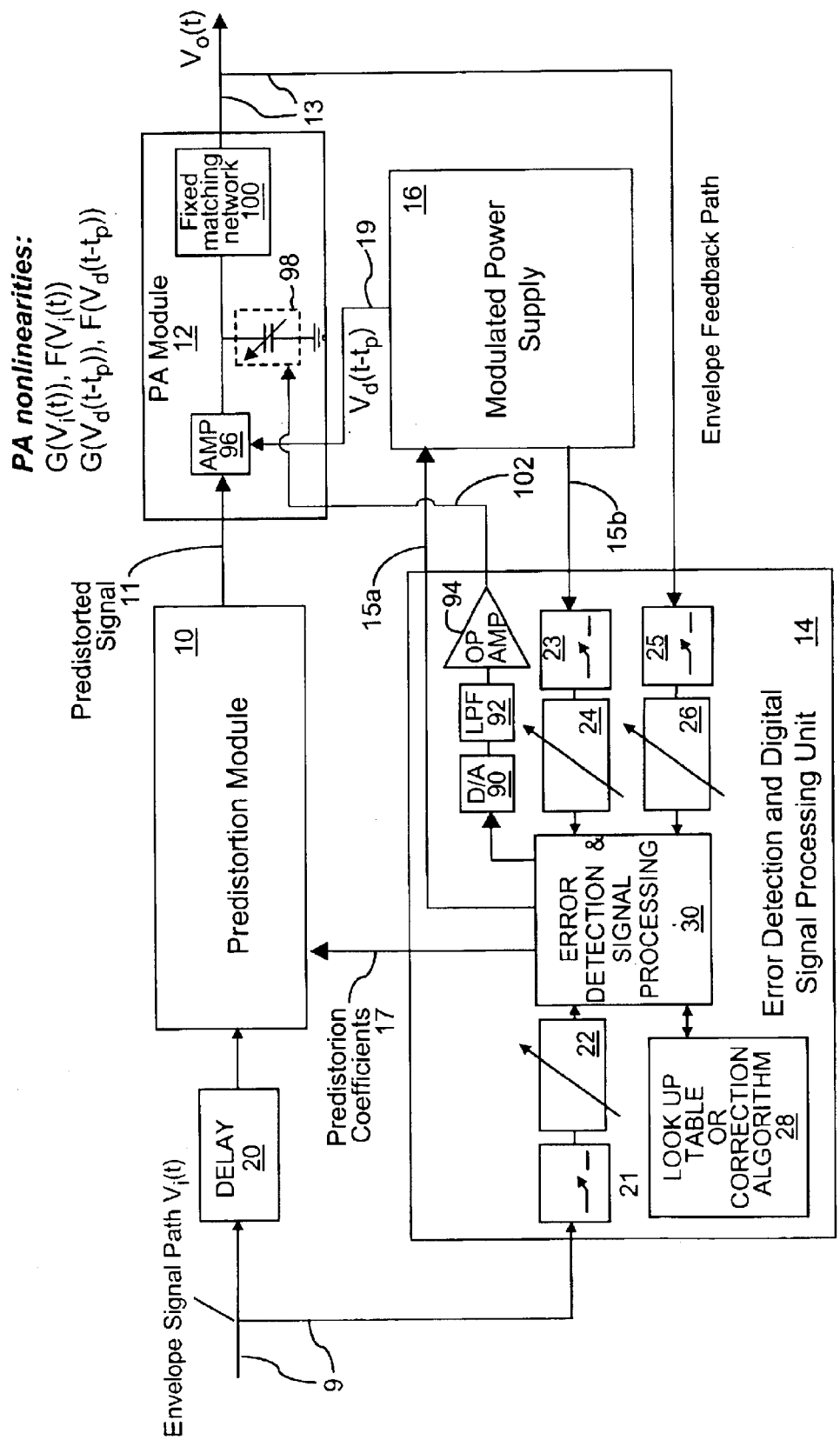
FIG. 10 is a schematic of an embodiment of a complete impedance matching solution within the power amplifier arrangement of FIG. 1.

FIG. 10 shows an embodiment of how the addition of a variable capacitor 98 would fit within the example system as originally described and shown in FIG. 1. The figure shows the same system from FIG. 1 with the addition of a digital-to-analog (D/A) converter 90, a low pass filter 92, and an operational amplifier (op-amp) 94 within the Error Detection and Signal Processing Unit 14. Also included, as an addition to the figure is a control signal line 102 that is used to control the variable capacitor 98 within the PA Module 12. The PA module 12 is also shown in an expanded view, which denotes the variable capacitor 98, a power amplifier 96 and a fixed matching network 100.

As described above in relation to FIG. 1, the Error Detection and Digital Signal Processing Unit 14 contains the block for Error Detection and Digital Signal Processing 30.

The D/A converter 90 is connected directly to the Error Detection and Digital Signal Processing block 30. In series with the D/A converter 90 is the low pass filter 92 and the operational amplifier 94. These three components are located within the Error Detection and Digital Signal Processing Unit 14. The control signal line 102 connects the operational amplifier 94 within the Error Detection and Digital Signal Processing Unit 14 to the variable capacitor 98 within the PA Module 12. The variable capacitor 98, the power amplifier 96 and the fixed matching network 100 within the PA Module 12 are connected in a manner similar manner to that shown in FIGS. 7A and 7B. The power amplifier 96 within the PA module 12 is connected to the output of the Predistortion Module 10. The variable capacitor 98 is located between the output of the power amplifier 96 and ground. The fixed matching network 100 is located at the output of the power amplifier 96.

The Error Detection and Digital Signal Processing block 30 is responsible for initially generating a proper form of a signal to drive the variable capacitor 98. Once the initial signal is generated it passes through the D/A converter 90, the low pass filter 92, and the operational amplifier 94. This conditioned form of the signal, now travelling on the control signal line 102, is supplied to modulate the capacitance of the variable capacitor 98. The control signal 102 is time delayed to arrive at the variable capacitor 98 at the same time as both the Predistorted Signal 11 arrives at the input to the PA module 12 and the power input $V_d(t-t_p)$ 19 to the PA module 12 arrives at the PA module 12. This is to ensure that the change in the capacitance of the variable capacitor 98 is synchronized with the change in the equivalent capacitance of the power amplifier 96, so as to result in a desired active compensation effect.

The manner used to determine the proper capacitance value to compensate for the change in the capacitance of the power amplifier is initially determined within the Error Detection and Digital Signal Processing block 30 by a suitable method such as being chosen from a look up table where the appropriate values are pre-programmed. This could be implemented by expanding Look Up Table 28 or with another separate look up table, currently not shown in FIG. 10.

The processing of signals through the amplifier arrangement of FIG. 8 operates similarly to that described for FIG. 1 above. The operation of the additional components for use with this embodiment is as follows: the Predistorted Signal 11 output from the Predistortion Module 10 is input to the power amplifier 96 in the PA Module 12, the Predistorted Signal 11 is amplified by the power amplifier 96 and the combination of the variable capacitor 98 (modulated by the associated control signal line 102 from the Error Detection and Digital Signal Processing block 30) and fixed matching network 100 are able to maintain the efficiency of the system. Finally, the fixed matching network 100 provides the output of the PA Module 12 denoted as $v_o t$) 13.

Any range or device value given herein may be extended or altered without losing the effect sought, as will be apparent to the skilled person for an understanding of the teachings herein.

Numerous modifications and variations of the present invention are possible in light of the above teachings. It is therefore to be understood that within the scope of the appended claims, the invention may be practised otherwise than as specifically described herein.

What is claimed is:

1. A power amplifier arrangement comprising:
   a power amplifier for receiving an input signal and amplifying said input signal to form an output signal, the power amplifier having an output capacitance which varies;

a power supply for supplying a power supply voltage to the power amplifier which is modulated proportionally with respect to changes in the input signal;

a variable capacitor having a variable capacitance which in combination with the output capacitance results in an adjusted output capacitance, wherein the variable capacitor is controlled so that the adjusted output capacitance is substantially constant.

2. A power amplifier arrangement according to claim 1, further comprising a signal processing unit for receiving said input signal and for providing a first control signal to the power supply, said signal processing unit forming said first control signal responsive to said input signal;

wherein the power supply modulates the power supply voltage in response to the first control signal so as to vary said power supply voltage proportionally with respect to changes in the input signal.

3. A power amplifier arrangement according to claim 2, wherein the signal processing unit is adapted to generate a second control signal to the variable capacitor which controls the variable capacitance of the variable capacitor for the purpose of maintaining the adjusted output capacitance to be substantially constant.

4. A power amplifier arrangement according to claim 3, wherein the input signal to the power amplifier is time delayed to allow the power supply voltage to be modulated in time with amplification of the input signal by the power amplifier; and wherein the second control signal is time delayed, synchronous with the input signal to the power amplifier, to allow the substantially constant adjusted output capacitance to be provided even while the output capacitance of the power amplifier is changing due to a change in operating power supplied to the power amplifier caused by modulation of the power amplifier power supply by the input signal.

5. A power amplifier arrangement according to claim 1, wherein the variable capacitor is located at an output stage of the power amplifier.

6. A power amplifier arrangement according to claim 1, further comprising an impedance matching network connected at the output of the power amplifier to provide impedance matching to an output impedance of the power amplifier.

7. A power amplifier arrangement according to claim 1, wherein the adjusted output capacitance is a function of the output capacitance, as well as a function of a capacitance of the variable capacitor, such that the adjusted output capacitance=f(output capacitance, capacitance of the variable capacitor), and wherein the capacitance of the variable capacitor is controlled such that the adjusted output capacitance is substantially constant.

8. A power amplifier arrangement according to claim 2, further comprising a predistortion module for providing a predistorted version of the input signal to the power amplifier, said predistortion module receiving from the signal processing unit predistortion coefficients for distorting said input signal, said predistortion coefficients being formed by said signal processing unit responsive to said input signal.

9. A power amplifier arrangement according to claim 2, wherein the signal processing unit receives a feedback signal from at least one of the power amplifier and the power supply and wherein said first control signal formed by the signal processing unit is formed using at least one of the input signal, a power supply feedback signal and a power amplifier feedback signal.

10. A power amplifier arrangement according to claim 1, wherein the variable capacitor is a high power, high Q-factor device.

11. A power amplifier arrangement according to claim 1, wherein the variable capacitor is a voltage controlled device.

12. A power amplifier arrangement according to claim 11, wherein the voltage controlled device is a micro-electromechanical system (MEMS) device.

13. A power amplifier arrangement according to claim 1, wherein the variable capacitor is a current controlled device.

14. A power amplifier arrangement according to claim 13, wherein the current controlled device is a micro-electromechanical system (MEMS) device.

15. A power amplifier arrangement according to claim 3, further comprising a digital-to-analog converter, a low pass filter and an operational amplifier, wherein the signal processing unit is adapted to generate the second control signal based on a lookup table means and supply the second control signal to the variable capacitor, via serial succession of the digital-to-analog converter, the low pass filter and the operational amplifier placed between the signal processing unit and the variable capacitor, which controls the variable capacitance of the variable capacitor so that the adjusted output capacitance is substantially constant.

16. A power amplifier arrangement according to claim 1, wherein the variable capacitor is a micro-electromechanical system (MEMS) device comprised of a flexible top plate, a fixed bottom plate, and at least one support post to support the flexible top plate.

17. A power amplifier arrangement according to claim 16, wherein the at least one support post consists of a single support post to support the flexible top plate, wherein the flexible top plate is attached to the single support post and the flexible top plate acts is a cantilever structure.

18. A power amplifier arrangement according to claim 16, comprising multiple support posts to support the flexible top plate wherein the flexible top plate is attached to the multiple support posts.

19. A power amplifier arrangement according to claim 16, formed from materials selected from a group consisting of silicon, polysilicon, and aluminium.

20. A method of operating a power amplifier arrangement, comprising the steps of:

providing an input signal to a power amplifier, the power amplifier amplifying the input signal to form an output signal, the power amplifier having an output capacitance which varies;

providing a power supply voltage to the amplifier to enable the power amplifier to amplify the input signal;

modulating the power supply voltage to the power amplifier in response to a first control signal received by the power supply from a signal processing unit, said signal processing unit forming said first control signal responsive to the input signal, wherein the power supply modulates the power supply voltage so as to vary said power supply voltage proportionally with respect to changes in the input signal;

providing a second control signal from the signal processing unit to a variable capacitor having a variable capacitance which in combination with the output capacitance results in an adjusted output capacitance, said signal processing unit adapted to generate the second control signal which controls the variable capacitance of the variable capacitor so that the adjusted output capacitance is substantially constant; and time delaying inputting of the input signal to the power amplifier in order to allow the power supply voltage to be modulated in time with amplification of the input signal by the power amplifier.

21. A method according to claim 20, further comprising the step of time delaying inputting the second control signal, synchronous with the input signal to the power amplifier, to the variable capacitor so that the variable capacitance of the variable capacitor is controlled for the purpose of maintaining the adjusted output capacitance to be substantially constant.

22. A method according to claim 20, further comprising the step of predistorting the input signal so as to provide the power amplifier with a predistorted version of the input signal for amplification.

23. A method according to claim 22, wherein the input signal is predistorted by a predistortion module which receives predistortion coefficients generated by the signal processing unit, said predistortion coefficients being generated by the signal processing unit responsive to the input signal.

24. A method according to claim 20, wherein the method further comprises providing to the signal processing unit a feedback signal from at least one of the power amplifier and the power supply and wherein the first control signal is formed by the signal processing unit utilizing at least one of the input signal, a power supply feedback signal and a power amplifier feedback signal.

25. A method of operating a power amplifier according to claim 20, wherein the variable capacitor is a voltage controlled device.

26. A method of operating a power amplifier according to claim 20, wherein the variable capacitor is a current controlled device.

27. A method of operating a power amplifier according to claim 20, wherein the variable capacitor is a micro-electromechanical system (MEMS) device.

28. A wireless communications base station transmitter including a power amplifier arrangement according to claim 1.

29. A communications network including a power amplifier arrangement according to claim 1.

30. A method of amplifying an input signal using a power amplifier having a power supply input, the method comprising the steps of:
receiving the input signal;
amplifying the input signal using the power amplifier to provide an output signal, the power amplifier having an output capacitance which varies;
modulating the power supply input to the power amplifier in accordance with a first control signal responsive to said input signal, wherein the method includes the step of time delaying inputting of the input signal to the power amplifier to allow the power supply input to be modulated in time with amplification of the input signal by the power amplifier; and
providing a second control signal to a variable capacitor having a variable capacitance which in combination with the output capacitance results in an adjusted output capacitance, wherein the second control signal controls the variable capacitance of the variable capacitor so that the adjusted output capacitance is substantially constant.

31. A method of amplifying a signal using a power amplifier having a power supply input according to claim 30, the method further comprising the step of time delaying inputting the second control signal, synchronous with the input signal to the power amplifier, to the variable capacitor so that the variable capacitance of the variable capacitor is controlled for the purpose of maintaining the adjusted output capacitance to be substantially constant.

32. A method of amplifying a signal using a power amplifier having a power supply input according to claim 30, wherein the variable capacitor is a voltage controlled device.

33. A method of amplifying a signal using a power amplifier having a power supply input according to claim 30, wherein the variable capacitor is a current controlled device.

34. A method of amplifying a signal using a power amplifier having a power supply input according to claim 30, wherein the variable capacitor is a micro-electromechanical system (MEMS) device.

35. A program for a computer for controlling a power amplifier arrangement comprising a power amplifier, a power supply, and a signal processing unit, the program comprising code to carry out the steps of:
providing an input signal to the power amplifier, the power amplifier amplifying the input signal to form an output signal, the power amplifier having an output capacitance which varies;
providing a power supply voltage to the power amplifier to enable the power amplifier to amplify the input signal;
modulating the power supply voltage to the power amplifier in response to a first control signal received by the power supply from a signal processing unit, said signal processing unit forming said control signal responsive to the input signal, wherein the power supply modulates the power supply voltage so as to vary said power supply voltage proportionally with respect to changes in the input signal;
providing a second control signal from the signal processing unit to a variable capacitor having a variable capacitance which in combination with the output capacitance results in an adjusted output capacitance, said signal processing unit adapted to generate the second control signal which controls the variable capacitance of the variable capacitor so that the adjusted output capacitance is substantially constant; and
time delaying inputting of the input signal to the power amplifier in order to allow the power supply voltage to be modulated in time with amplification of the input signal by the power amplifier.

36. A program for a computer for controlling a power amplifier arrangement according to claim 35, the program further comprising code to carry out the step of time delaying inputting the second control signal, synchronous with the input signal to the power amplifier, to the variable capacitor so that the variable capacitance of the variable capacitor is controlled for the purpose of maintaining the adjusted output capacitance to be substantially constant.

37. A method of providing a signal transmission service over a communications network including a power amplifier arrangement according to claim 1.

* * * * *